United States Patent [19]

Iwamuro

[11] Patent Number: 5,360,983
[45] Date of Patent: Nov. 1, 1994

[54] INSULATED GATE BIPOLAR TRANSISTOR HAVING A SPECIFIC BUFFER LAYER RESISTANCE

[75] Inventor: Noriyuki Iwamuro, Kanagawa, Japan

[73] Assignee: Fuji Electric Co., Ltd., Kanagawa, Japan

[21] Appl. No.: 46,956

[22] Filed: Apr. 16, 1993

[30] Foreign Application Priority Data

Sep. 29, 1992 [JP] Japan ................. 4-258717

[51] Int. Cl.$^5$ ................. H01L 27/082; H01L 29/70; H01L 27/088
[52] U.S. Cl. ................. 257/139; 257/140; 257/142
[58] Field of Search ................. 257/139, 138, 147, 142

[56] References Cited

U.S. PATENT DOCUMENTS 5,124,772  6/1992  Hideshima et al. ................. 257/139
5,237,183  8/1993  Fay et al. ................. 257/139

*Primary Examiner*—Rolf Hille
*Assistant Examiner*—Wael Fahmy
*Attorney, Agent, or Firm*—Finnegan, Henderson, Farabow, Garrett & Dunner

[57] ABSTRACT

An $n^+$ buffer layer, that is located between an $n^-$ base layer and a $p^+$ substrate, has a resistivity in the range of 0.005–0.03 $\Omega$cm and a thickness not more than 10$\mu$m. Further, the base layer has an impurity concentration not more than $(0.3 \times I_1)/(S \times 1.6 \times 10^{-19} \times 6.0 \times 10^6)$, where $I_1$ is a rated current in ampere and S is an effective are in cm$^2$.

3 Claims, 4 Drawing Sheets

INSULATED GATE BIPOLAR TRANSISTOR HAVING A SPECIFIC BUFFER LAYER RESISTANCE

BACKGROUND OF THE INVENTION

The present invention relates to an insulated gate bipolar transistor (hereinafter abbreviated as IGBT) that is used as a power switching device.

In recent years, the IGBT has come to be commonly used as a power switching device. The IGBT has a structure in which a reverse conduction-type layer is added to the drain region of the longitudinal MOSFET at its drain electrode side. More specifically, FIG. 2 shows a unit cell of the IGBT. A high-resistivity n⁻ layer 3 is formed on a p+ substrate 1 via a low-resistivity n+ layer 2. Further, a p layer 4 is selectively formed in a surface layer of the n⁻ layer 3, and an n+ layer 5 is selectively formed in a surface layer of the p layer 4. A surface portion of the p layer 4 that is located between the n⁻ layer 3 and the n+ layer 5 serves as a channel region, and a gate electrode 7, that is connected to a gate terminal G, is formed on the channel region via a gate insulating film 6. A source electrode 9, that is insulated from the gate electrode 7 by an insulating film 8 and connected to a source terminal S, is in contact with the p layer 4 and the n⁻ layer 5. A drain electrode 10, that is connected to a drain terminal D, is in contact with the p+ substrate 1.

When a positive voltage is applied to the gate terminal G and the drain terminal D while the source terminal S is grounded, a built-in MOSFET is turned on that consists of the n+ layer 2, n⁻ layer 3, p layer 4, n+ layer 5, gate electrode 7 and source electrode 9, so that electrons flow into the n⁻ layer 3 via the channel region. On the other hand, holes are injected into the n⁻ layer 3 from the p+ substrate 1 via the n+ layer 2 by a quantity corresponding to that of the electrons flowing into the n⁻ layer 3. As a result, a conductivity modulation occurs in the n⁻ layer 3 to reduce the resistance of this layer. Therefore, the IGBT is turned on with a low on-resistance.

While having a small on-voltage, the above-described conventional IGBT is associated with a problem that due to a low electron-hole recombination rate in the n⁻ layer 3 the switching time is long and therefore the switching loss is large. To solve this problem, i.e., to increase the electron-hole recombination rate, the life time may be reduced by introducing life time killers by illuminating the silicon base with an electron beam or by gold diffusion. However, these measures unavoidably increase the on-voltage of the IGBT. That are, the on-voltage and the switching time is in a tradeoff relationship, and it is very difficult to improve both characteristics at the same time.

SUMMARY OF THE INVENTION

An object of the present invention is to provide, by breaking the tradeoff relationship described above, an IGBT which can realize both of a low on-voltage and a short switching time.

According to the invention, an insulated gate bipolar transistor comprises in a semiconductor base a first region of a first conduction type and a second region of a second conduction type formed on the first region. A third region of the second conduction type is formed on the second region and has a low impurity concentration. A fourth region of the first conduction type is selectively formed in a surface layer of the third region. A fifth region of the second conduction type is selectively formed in a surface layer of the fourth region and has a high impurity concentration.

The insulated gate bipolar transistor further comprises a gate electrode formed, via a gate insulating film, on a surface portion of the fourth region which portion is interposed between the third and fifth regions and serves as a channel region. A source electrode is commonly in contact with the fourth and fifth regions, and a drain electrode is in contact with the first region. The second region has a resistivity in a range of 0.005 to 0.03 $\Omega$cm and a thickness not more than 10 $\mu$m.

It is preferred that the impurity concentration of the third region be not more than 30% of a concentration of minority carriers flowing through a depletion layer of the third region at a turn-off. That is, if the second conduction type is n type, it is preferred that the impurity concentration of the third region be not more than $(0.3 \times I_1)/(S \times 1.6 \times 10^{-19} \times 6.0 \times 10^6)$, where $I_1$ is a rated current in ampere and S is an effective area in cm² of the semiconductor base.

By setting the impurity concentration of the second region at a higher value to provide the resistivity of 0.005–0.03 $\Omega$cm, the recombination time can be shortened and the rapidly decaying tail current can be obtained without the need of life time control such as electron beam illumination. Further, by setting the impurity concentration of the third region within the range mentioned above, the depletion layer reaches the second region faster during a turn-off.

DESCRIPTION OF THE PREFERRED EMBODIMENT

Figure 2:
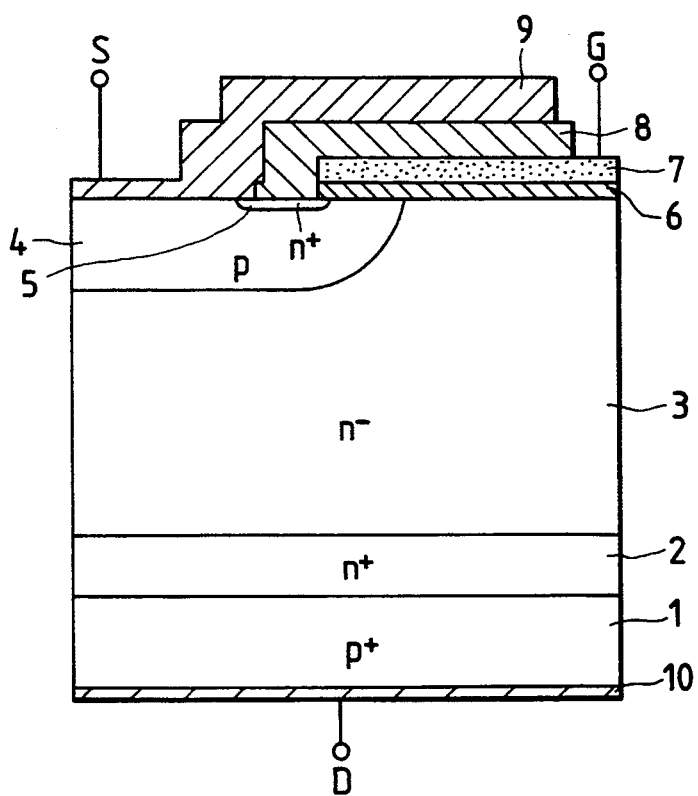
FIG. 2 is a sectional view of an IGBT.

An IGBT having the structure of FIG. 2 was produced in the following manner. First, an n+ buffer layer (second region) 2 and an n⁻ layer (third region) 3 were sequentially formed, by epitaxial growth, on a p+ substrate (first region) 1 of a resistivity 0.01 $\Omega$cm. After a silicon oxide film 6 was thereon, patterning was performed using the same mask to form a gate oxide film 6 and a gate electrode 7 as a mask. Then, a p layer 4 was formed by performing ion implantation and thermal diffusion using the gate electrode 7. Then, an n+ layer 5 was formed by performing ion implantation and thermal diffusion using the gate electrode 7 and a photoresist film as a mask. Subsequently, a source electrode 9 was formed via an insulating film 8 and a drain electrode 10 was formed on the opposite face, to complete the device. This device was not subjected to any measures, such as electron beam illumination and gold diffusion, for increasing the recombination rate.

Figure 1:
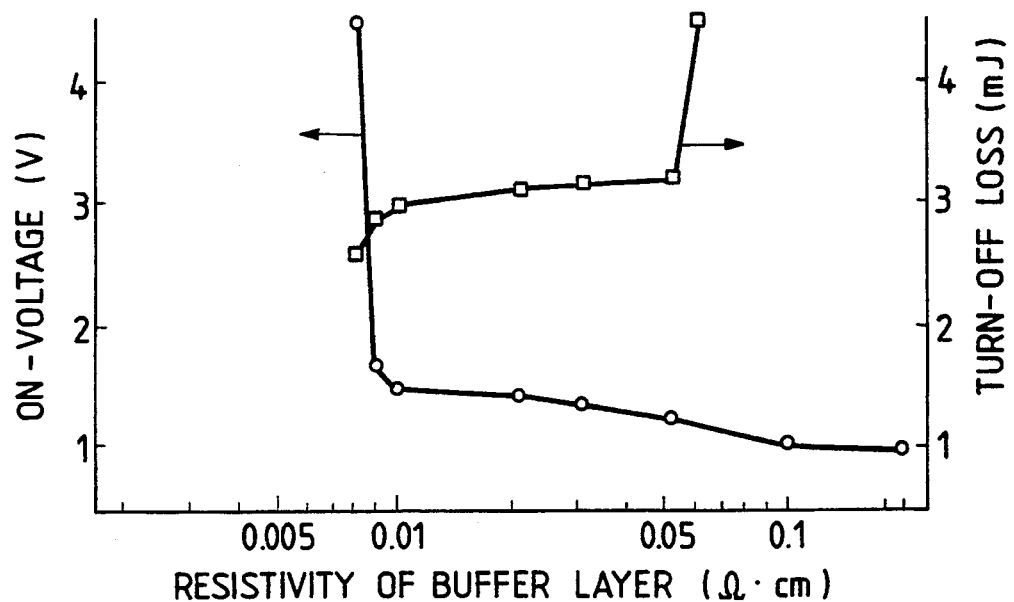
FIG. 1 is a graph showing variations of the on-voltage and the turn-off loss with respect to the resistivity of an n+ buffer layer when its thickness is 5 $\mu$m.

FIG. 1 shows variations of the on-voltage $V_{CE(sat)}$ (V) and the turn-off loss $E_{off}$(mJ) of the above IGBT at a current density 100 A/cm² when the resistivity of the n+ buffer layer 2 was changed in the range of 0.002–0.2 Ωcm. The thickness of and the thickness of the n⁻ base layer 3 were $2.1 \times 1.0^{13}$ cm⁻³ and 50 μm, respectively, which values were also employed in the experiments described below. One can see from FIG. 1 that the on-voltage sharply increases in a low resistivity side starting at 0.008 Ωcm. Further, although the turn-off loss also increases on a high resistivity side, this increase is not so sharp as the above increase of the on-voltage.

Figure 3:
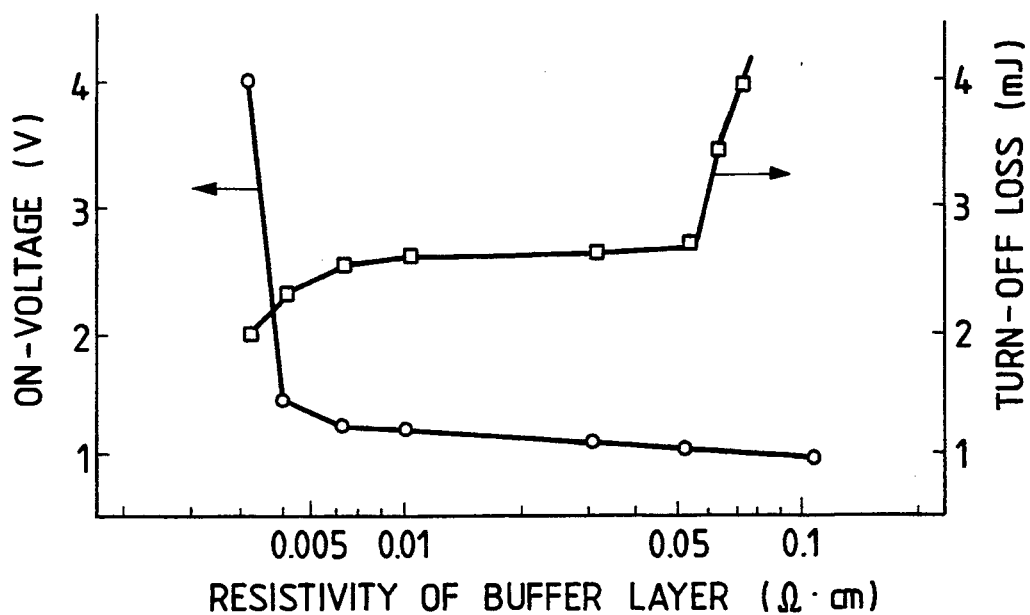
FIG. 3 is a graph showing variations of the on-voltage and the turn-off loss with respect to the resistivity of the n+ buffer layer when its thickness is 2 $\mu$m.

FIG. 3 shows dependencies of $V_{CE(sat)}$ and $E_{off}$ on the resistivity of the n+ buffer layer 2 when its thickness is 2 μm. The two curves have increases similar to those in FIG. 1 but starting at 0.005 μcm. Similar measurements performed for the case where the n+ buffer layer 2 is 10 μm in thickness exhibited increases similar to those in FIGS. 1 and 3 but starting at 0.03 Ωcm.

Figure 4:
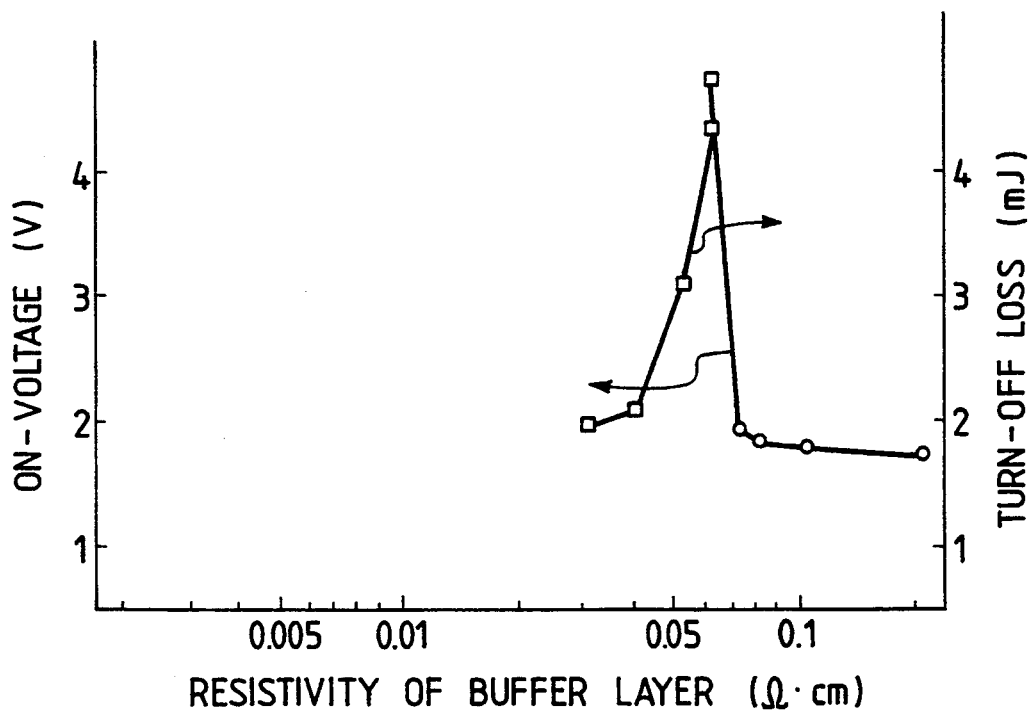
FIG. 4 is a graph showing variations of the on-voltage and the turn-off loss with respect to the resistivity of the n+ buffer layer when its thickness if 11 $\mu$m.

FIG. 4 shows measurement results when the thickness of the n+ buffer layer 2 was 11 μm. Although the on-voltage sharply increases starting at 0.06 Ωcm, the turn-off loss starts to deteriorate at 0.05 Ωcm. Therefore, there exists no condition which improves the $V_{CE(est)}$—$E_{off}$ tradeoff relationship. On the other hand, when the n+ buffer layer 2 was thinner than 2 μm, the forward breakdown voltage $V_{BD}$, which was 700 V when the layer 2 was 2-μm thick, utterly decreased, for example, to 125 V when the thickness was 1.9 μm. These results were also found when the impurity concentration of the n⁻ base layer 3 was $4.0 \times 10^{13}$ cm⁻³ and $5.0 \times 10^{13}$ cm⁻³.

Figure 5:
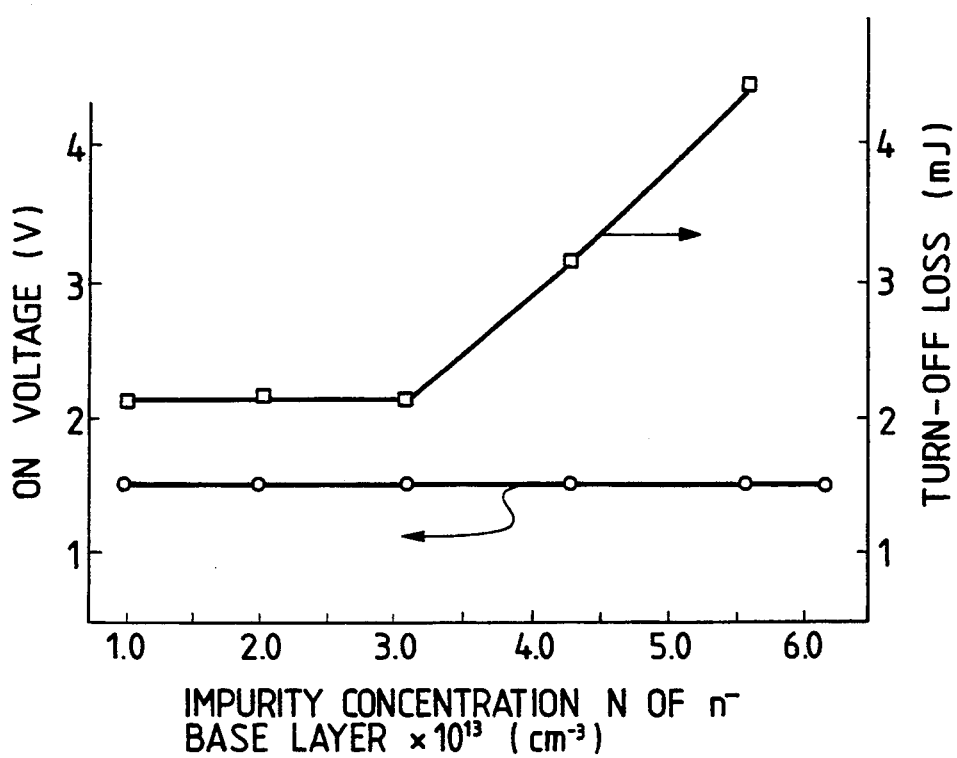
FIG. 5 is a graph showing variations of the on-voltage and the turn-off loss with respect to the impurity concentration of the n⁻ base layer.

FIG. 5 shows variations of $V_{CE(sat)}$ and $E_{off}$ when the impurity concentration N of the n⁻ base layer 3 was changed. This measurement was performed on a device having a rated current $I_1 = 50$ A and an effective area $S = 0.5$ cm². One can see from FIG. 5 that $E_{off}$ is very small when N is smaller than $3.13 \times 10^{13}$ cm⁻³. This value of N is equal to 30% of the concentration P of holes flowing through the depletion layer during the turn-off period, where $P = I_1/(S \cdot q \cdot V_{sat}) = I_1/(S \times 1.6 \times 10^{-19} \times 6.0 \times 10^6)$. That is, when N is smaller than 30% of the concentration of holes flowing through the depletion layer, the effective positive charge N+P is low, in which case the depletion layer develops faster. As a result, the turn-off current is small when an inductive load without a snub circuit is connected to the device. A similar measurement performed on a device having $I_1 = 25$ A and $S = 0.5$ cm² also showed the sudden improvement of the turn-off loss when N was decreased from 30% of the concentration of holes. Since this characteristic depends only on the Poisson's equation, $\mathrm{div} \cdot \mathrm{grad} \psi = q(N_d - N_a + p - n)/\epsilon$, it is not influenced much by the value of the rated current $I_1$.

Simulations were performed on the IGBT of the invention that is based on the above measurements.

Figure 6:
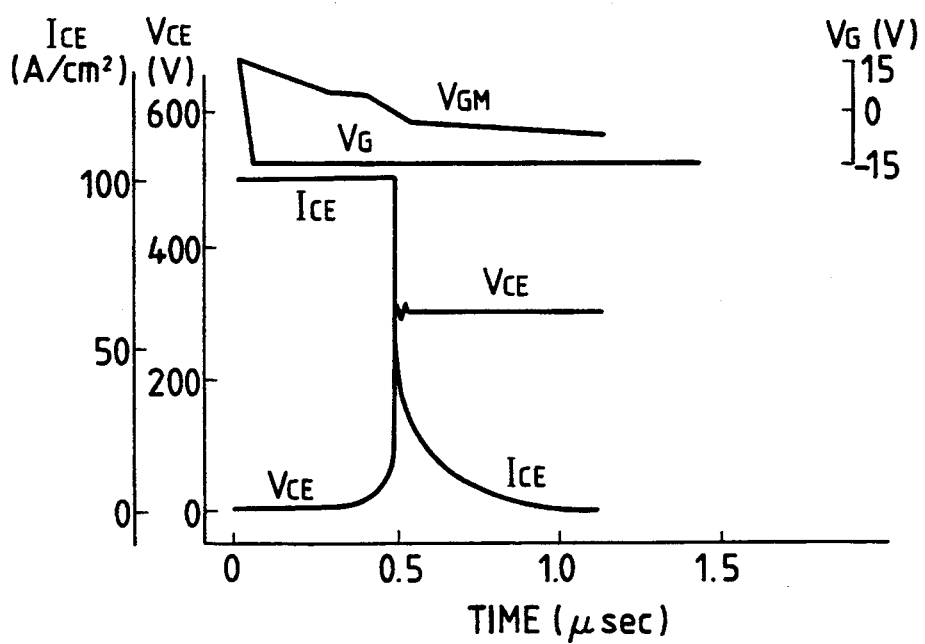
FIG. 6 shows simulated turn-off waveforms of an IGBT according to an embodiment of the present invention.
Figure 7A:
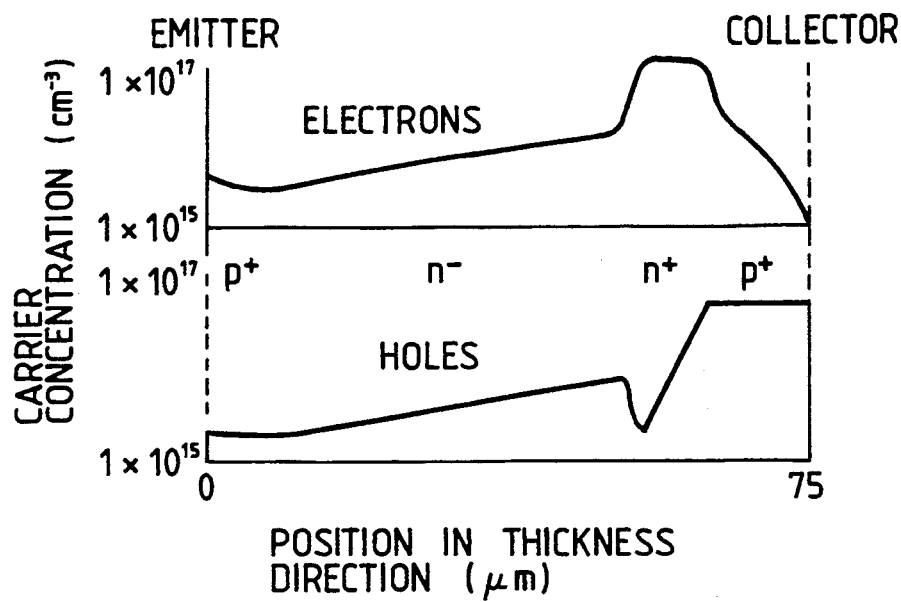
FIG. 7(a) shows simulated on-state carrier distributions of the IGBT of the embodiment.
Figure 7B:
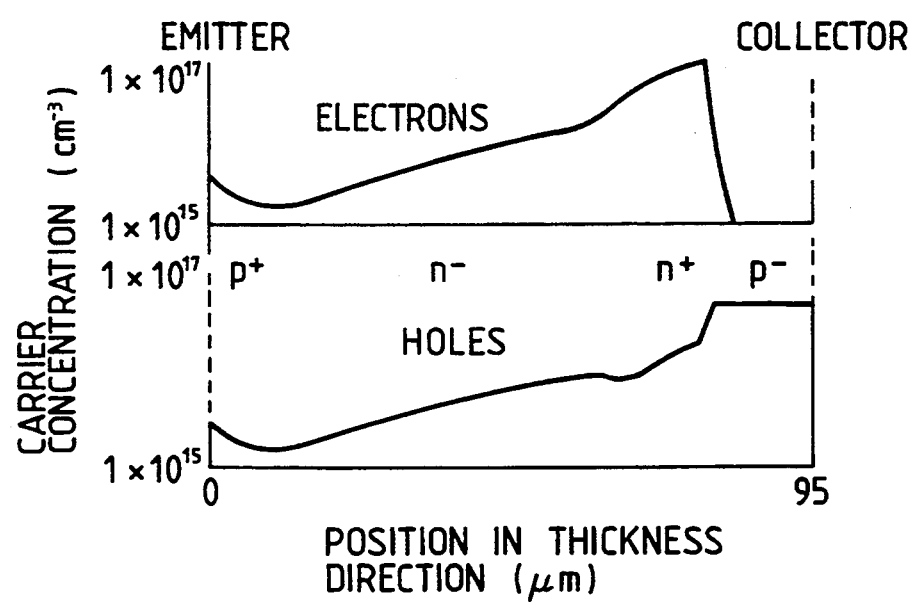
FIG. 7(b) shows simulated on-state carrier distributions of a conventional IGBT.

FIG. 6 shows simulation results, i.e., IGBT turn-off waveforms when the n+ buffer layer 2 had a resistivity 0.01 Ωcm and a thickness 5 μm and the n⁻ layer 3 had an impurity concentration $2 \times 10^{13}$ cm⁻³ and a thickness 50 μm. It is found that the tail current decreases rapidly. One can see a rapid decay of the tail current. FIGS. 7(a) and 7(b) show simulation results of carrier concentrations in an IGBT of the embodiment of the invention (FIG. 7(a)) and a conventional IGBT (FIG. 7(b)) when they are turned on and in a steady state and have a current density 100 A/cm². As seen from FIG. 7(a), the IGBT of the embodiment has a flatter carrier distribution, whereby the diffusion current component of the hole current becomes close to zero and the contribution of the hole current to the total current is lowered compared to the conventional case. Since the electron mobility is about two times larger than the hole mobility and the diffusion coefficient of electrons is larger than that of holes, the IGBT of the invention has a smaller on-voltage for the same carrier concentration.

According to the invention, the IGBT having a low on-voltage and a small turn-off loss can be obtained by properly setting the resistivity and thickness of the n+ buffer layer, and further by making the impurity concentration of n⁻ base layer not more than 30% of the concentration of holes flowing through the depletion layer at a turn-off.

What is claimed is:

1. An insulated gate bipolar transistor comprising in a semiconductor base:

a first region of a first conduction type;

a second region of a second conduction type formed on the first region;

a third region of the second conduction type formed on the second region and having a low impurity concentration;

a fourth region of the first conduction type selectively formed in a surface layer of the third region; and a fifth region of the second conduction type selectively formed in a surface layer of the fourth region and having a high impurity concentration; said insulated gate bipolar transistor further comprising:

a gate electrode formed, via a gate insulating film, on a surface portion of the fourth region which portion is interposed between the third and fifth regions and serves as a channel region;

a source electrode being commonly in contact with the fourth and fifth regions; and a drain electrode being in contact with the first region;

wherein the second region has a resistivity in a range of 0.005 to 0.03 Ωcm and a thickness not more than 10 μm.

2. The insulated gate bipolar transistor of claim 1, wherein the impurity concentration of the third region is not more than 30% of a concentration of minority carriers flowing through a depletion layer of the third region at a turn-off.

3. The insulated gate bipolar transistor of claim 2, wherein the impurity concentration of the third region is not more than $(0.3 \times I_1)/(S \times 1.6 \times 10^{-19} \times 6.0 \times 10^6)$, where $I_1$ is a rated current in ampere and S is an effective area in cm² of the semiconductor base.

* * * * *

UNITED STATES PATENT AND TRADEMARK OFFICE
CERTIFICATE OF CORRECTION

PATENT NO. : 5,360,983
DATED : November 01, 1994
INVENTOR(S) : Noriyuki IWAMURO

It is certified that error appears in the above-indentified patent and that said Letters Patent is hereby corrected as shown below:

Claim 1, Column 4, Line 53 change "0.03" to --0.023--.

Signed and Sealed this

Second Day of May, 1995

Attest:

BRUCE LEHMAN

Attesting Officer

Commissioner of Patents and Trademarks